United States Patent
Hirose et al.

(10) Patent No.: US 9,514,915 B2
(45) Date of Patent: Dec. 6, 2016

(54) METHOD FOR EVALUATING CHARGED PARTICLE BEAM DRAWING APPARATUS

(71) Applicant: NuFlare Technology, Inc., Yokohama-shi (JP)

(72) Inventors: Satoru Hirose, Isogo-ku (JP); Takayuki Ohnishi, Konan-ku (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 14/956,860

(22) Filed: Dec. 2, 2015

(65) Prior Publication Data

US 2016/0233052 A1    Aug. 11, 2016

(30) Foreign Application Priority Data

Feb. 10, 2015    (JP) ................. 2015-024309

(51) Int. Cl.
*H01J 37/00*  (2006.01)
*H01J 37/304*  (2006.01)
*H01J 37/317*  (2006.01)

(52) U.S. Cl.
CPC ........ *H01J 37/3045* (2013.01); *H01J 37/3174* (2013.01)

(58) Field of Classification Search
None
See application file for complete search history.

(56) References Cited

U.S. PATENT DOCUMENTS

| | | | |
|---|---|---|---|
| 7,893,411 B2* | 2/2011 | Nishimura | B82Y 10/00 250/492.22 |
| 8,822,960 B2* | 9/2014 | Ozawa | H01J 37/045 250/310 |
| 9,147,552 B2* | 9/2015 | Motosugi | H01J 37/3026 |
| 2013/0141563 A1* | 6/2013 | Setoguchi | H01J 37/28 348/79 |
| 2015/0041671 A1* | 2/2015 | Motosugi | H01J 37/3026 250/396 R |
| 2015/0228453 A1* | 8/2015 | Nishimura | H01J 37/3174 250/396 R |

FOREIGN PATENT DOCUMENTS

| | | | |
|---|---|---|---|
| JP | 2009-88202 | | 4/2009 |
| JP | 2009088202 A | * | 4/2009 |
| JP | 2012-151314 | | 8/2012 |
| JP | 2012151314 A | * | 8/2012 |
| JP | 2014-183267 | | 9/2014 |

* cited by examiner

*Primary Examiner* — Andrew Smyth
(74) *Attorney, Agent, or Firm* — Oblon, McClelland, Maier & Neustadt, L.L.P.

(57) ABSTRACT

In one embodiment, a charged particle beam drawing apparatus performs drawing by deflecting a charged particle beam with a deflector. A method for evaluating the apparatus includes making a shot of a first pattern, controlling a deflection amount by the deflector to move an applied position of the beam from the first pattern along a first direction to make a shot of a second pattern, controlling the deflection amount to move the applied position from the second pattern along the first direction to make a shot of a third pattern, controlling the deflection amount to move the applied position from the third pattern along a second direction opposite to the first direction to make a shot of a fourth pattern between the second pattern and the third pattern, calculating an interval between the second pattern and the fourth pattern, and comparing the calculated interval to a reference interval.

8 Claims, 8 Drawing Sheets

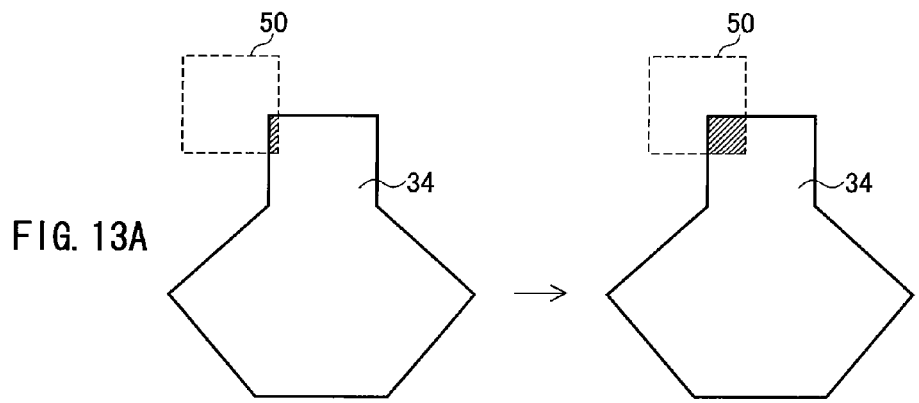
FIG. 13A
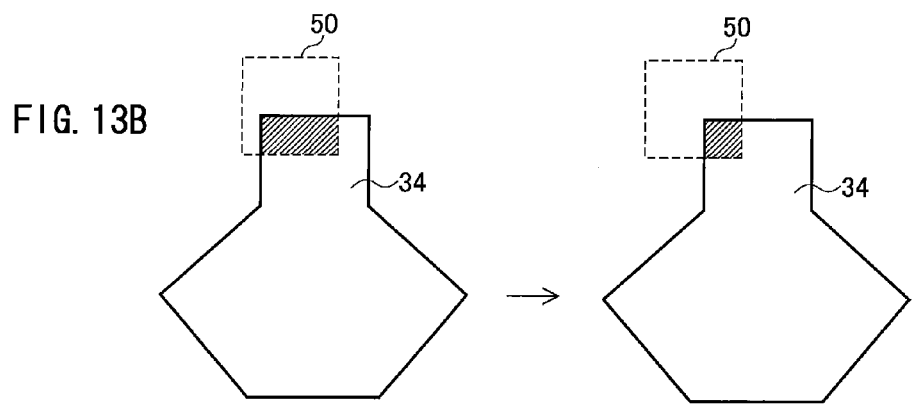
FIG. 13B
FIG. 14A
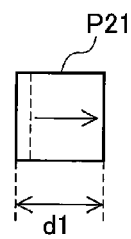
FIG. 14B
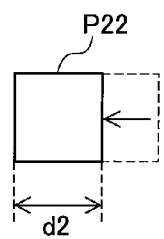

METHOD FOR EVALUATING CHARGED PARTICLE BEAM DRAWING APPARATUS

CROSS REFERENCE TO RELATED APPLICATION

This application is based upon and claims benefit of priority from the Japanese Patent Application No. 2015-24309, filed on Feb. 10, 2015, the entire contents of which are incorporated herein by reference.

FIELD

The present invention relates to a method for evaluating a charged particle beam drawing apparatus.

BACKGROUND

With high integration of LSIs, a circuit line width required for a semiconductor device has been made to be very small year by year. In order to form a desired circuit pattern in a semiconductor device, a method is used in which by using a reduction projection type exposure apparatus, a high-accuracy original pattern (a mask, or in particular, one used by a stepper or a scanner is also referred to as reticle) formed on a quartz is reduced and transferred onto a wafer. The high-accuracy original pattern is drawn by an electron beam drawing apparatus, that is, an electron beam lithography technique is used.

The electron beam drawing apparatus performs drawing by deflecting an electron beam with a deflector. Examples of a role of the beam deflection by the deflector include control of the shape or size of a beam shot, control of the position of the shot, and blanking of the beam. When the deflector is driven with an output voltage from a DAC (digital analog converter) amplifier, a settling time for the output voltage corresponding to the load of the deflector is required. If the settling time is insufficient, an error in a movement amount of the electron beam due to the deflection occurs, causing a decrease in the accuracy of drawing. On the other hand, if the settling time is excessively long, a throughput decreases. Thus, it is desirable to set a settling time as short as possible within a range where the accuracy of drawing does not decrease.

In the related art, while a settling time is changed, a beam is deflected in a single direction (e.g., a +X direction) to draw an evaluation pattern (including development) with respect to a mask for evaluation, the drawing position is measured by using a position measuring device, and a shortest settling time among settling times with which a deflection shift amount from a design coordinate falls within a certain range is determined as an optimum settling time. However, with increasing the accuracy of a circuit pattern and making the circuit pattern to be minute, in a measurement result of a deflection shift amount of a drawn position from a design coordinate, it is difficult to separate a shift amount depending on the settling time and a shift amount due to variation of dimension/position caused by a process, an measurement error (measurement variations) of a position measuring device, or the like.

As described above, in the related art, due to another error factor such as measurement variations of the position measuring device, it is not possible to accurately evaluate the deflection shift amount depending on the settling time, so that it is not possible to obtain an optimum settling time.

BRIEF DESCRIPTION OF THE DRAWINGS

FIGS. 13A and 13B are diagrams illustrating a method for drawing an evaluation pattern according to a second embodiment.

FIGS. 14A and 14B are diagrams showing an example of an evaluation pattern.

DETAILED DESCRIPTION

In one embodiment, a charged particle beam drawing apparatus performs drawing by deflecting a charged particle beam with a deflector disposed on an optical path for the charged particle beam. A method for evaluating the apparatus includes making a shot of a first pattern, controlling an amount of deflection by the deflector to move an applied position of the charged particle beam from the first pattern along a first direction, and making a shot of a second pattern, controlling the amount of deflection by the deflector to move the applied position of the charged particle beam from the second pattern along the first direction, and making a shot of a third pattern, controlling the amount of deflection by the deflector to move the applied position of the charged particle beam from the third pattern along a second direction opposite to the first direction, and making a shot of a fourth pattern between the second pattern and the third pattern, measuring positions of the second pattern and the fourth pattern and calculating an interval between the second pattern and the fourth pattern, and comparing the calculated interval to a reference interval.

Hereinafter, in each embodiment, a configuration using an electron beam will be described as an example of a charged particle beam. However, the charged particle beam is not limited to the electron beam, and may be an ion beam or the like. In addition, a variable shaping type drawing apparatus will be described as an example of a charged particle beam drawing apparatus.

First Embodiment

Figure 1:
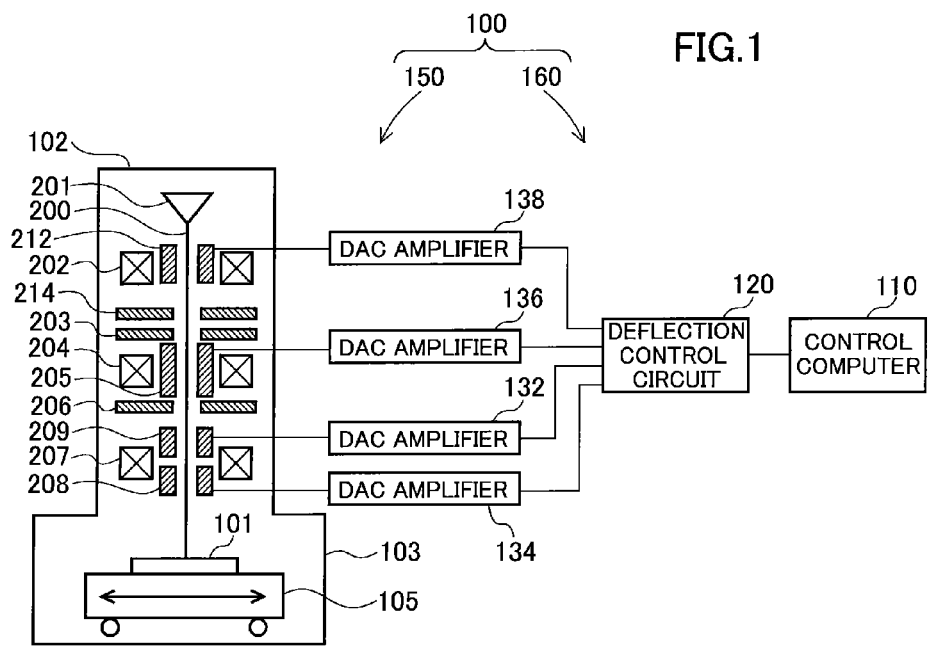
FIG. 1 is a schematic configuration diagram of a drawing apparatus according to a first embodiment.

FIG. 1 is a schematic configuration diagram of a drawing apparatus according to the present embodiment of the present invention. As in FIG. 1, the drawing apparatus 100 includes a drawing unit 150 and a control unit 160. The drawing apparatus 100 is an example of an electron beam drawing apparatus. The drawing unit 150 includes an electric barrel 102 and a drawing chamber 103. Within the electric barrel 102, an electron gun 201, an illumination lens 202, a blanking deflector (blanker) 212, a blanking aperture 214, a first shaping aperture 203, a projection lens 204, a shaping deflector 205, a second shaping aperture 206, an objective lens 207, a main deflector 208, and a sub deflector 209 are disposed. A sub sub deflector may be further provided below the main deflector 208.

Within the drawing chamber 103, an XY stage 105 which is movable at least in an XY direction is disposed. A substrate 101 which is a drawing target is disposed on the XY stage 105. The substrate 101 includes a mask for exposure, a silicon wafer, and the like which are used for manufacturing a semiconductor device. The mask includes a mask blank.

The control unit 160 includes a control computer 110, a deflection control circuit 120, and digital analog conversion (DAC) amplifier units 132, 134, 136, and 138. The deflection control circuit 120 is connected to the respective DAC amplifiers 132, 134, 136, and 138. The DAC amplifier unit 132 is connected to the sub deflector 209. The DAC amplifier unit 134 is connected to the main deflector 208. The DAC amplifier unit 136 is connected to the shaping deflector 205. The DAC amplifier unit 138 is connected to the blanking deflector 212.

When passing within the blanking deflector 212, an electron beam 200 emitted from the electron gun 201 (emission portion) is controlled by the blanking deflector 212 in a beam ON state so as to pass through the blanking aperture 214, and is deflected by the blanking deflector 212 in a beam OFF state such that the entire beam is blocked by the blanking aperture 214. The electron beam 200 that passes through the blanking aperture 214 after the state shifts from beam OFF to beam ON until the state becomes beam OFF makes a single electron beam shot.

The blanking deflector 212 controls the direction of the electron beam 200 passing therethrough, to alternately generate a beam ON state and a beam OFF state. For example, a voltage may not be applied in a beam ON state, and a voltage may be applied to the blanking deflector 212 in beam OFF. An irradiation amount of the electron beam 200 applied to the substrate 101 per shot is adjusted by an irradiation time period of each shot.

The electron beam 200 of each shot which is generated by passing through the blanking deflector 212 and the blanking aperture 214 as described above illuminates the entire first shaping aperture 203 having a rectangular hole by the illumination lens 202. Here, first, the electron beam 200 is shaped into a rectangular shape.

Then, the electron beam 200 of an aperture image having passed through the first shaping aperture 203 is projected onto the second shaping aperture 206 by the projection lens 204. Deflection of the aperture image on the second shaping aperture 206 is controlled by the shaping deflector 205, whereby it is possible to change the beam shape and dimension. Such variable shaping is performed every shot, and the beam is shaped into a different shape and dimension for each shot.

The electron beam 200 having passed through the second shaping aperture 206 is focused by the objective lens 207, is deflected by the main deflector 208 and the sub deflector 209, and is applied to a desired position on the substrate 101 disposed on the XY stage 105 which continuously moves. As described above, a plurality of shots of the electron beam 200 are sequentially deflected onto the substrate 101 by each deflector.

Figure 2:
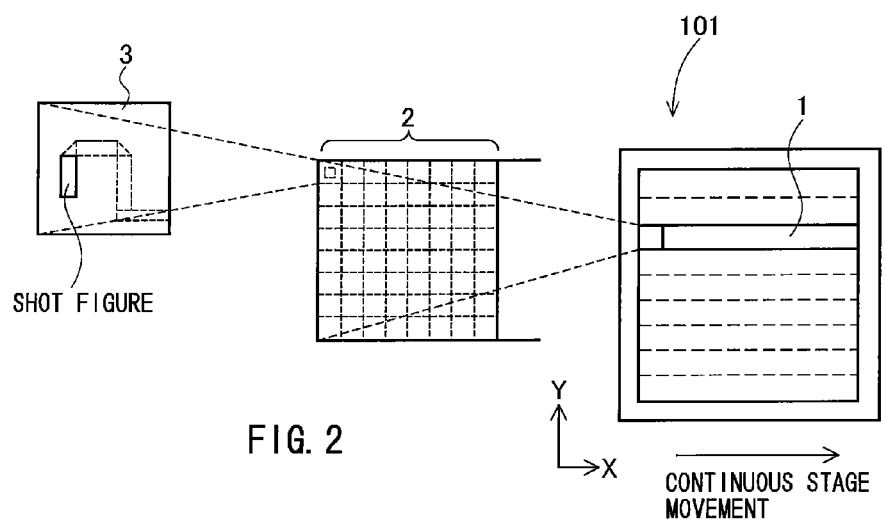
FIG. 2 is a conceptual diagram showing a main deflection region and a sub deflection region.

FIG. 2 is a schematic diagram showing a main deflection region and a sub deflection region. As shown in FIG. 2, when a desired pattern is drawn by the drawing apparatus 100, a drawing region on the substrate 101 is divided into a plurality of drawing regions (stripes) 1 which have a width with which deflection is possible by the main deflector 208 and which are formed, for example, in a stripe shape in a Y direction. Each stripe 1 is segmented in an X direction into sections having the same width as each stripe in the Y direction. Each of the segmented regions is a main deflection region 2 where deflection is possible by the main deflector 208. Each of regions into which the main deflection region 2 is further subdivided is a sub deflection region 3 (or referred to as sub field).

The sub deflector 209 is used for controlling the position of the electron beam 200 at each shot at high speed with high accuracy. Thus, the deflection range is limited to the sub deflection region 3, and deflection beyond this region is performed by the main deflector 208 moving the position of the sub deflection region 3. On the other hand, the main deflector 208 is used for controlling the position of the sub deflection region 3, and moves within the range where a plurality of the sub deflection regions 3 are included (the main deflection region 2). In addition, since the XY stage 105 continuously moves in the X direction during drawing, it is possible to follow the movement of the XY stage 105 by moving (tracking) a drawing origin on each sub deflection region 3 at all times with the main deflector 208.

In the present embodiment, an evaluation substrate is placed as the substrate 101 on the XY stage 105, and the following evaluation pattern is drawn, and a deflection shift amount depending on a settling time (sub deflection settling time) for the DAC amplifier 132 is evaluated.

Figure 3:
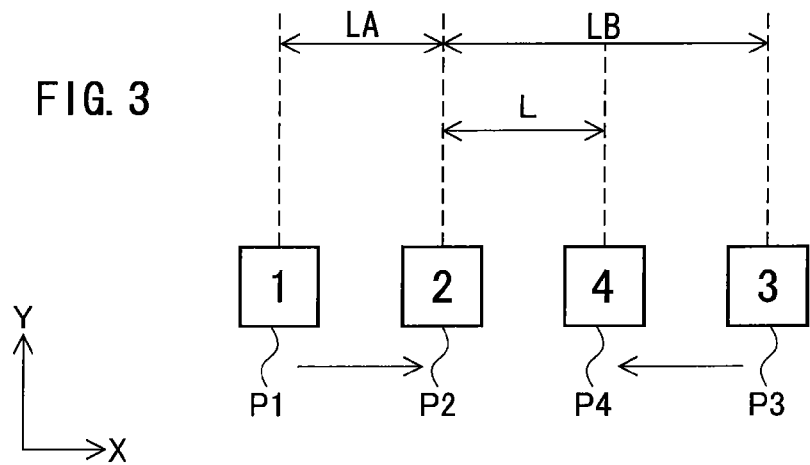
FIG. 3 is a diagram showing an example of an evaluation pattern.

FIG. 3 shows an example of the evaluation pattern for evaluating the deflection shift amount depending on the sub deflection settling time. As shown in FIG. 3, the evaluation pattern includes a plurality of patterns P1 to P4 aligned along one direction (the X direction in FIG. 3) so as to be spaced apart from each other. Each of the patterns P1 to P4 is, for example, a rectangular pattern having a side which is about 50 nm.

In this example, first, a shot of the pattern P1 is made. Next, the shot position of the electron beam is moved from the pattern P1 along the +X direction, and a shot of the pattern P2 is made. Next, the shot position of the electron beam is moved from the pattern P2 along the +X direction, and a shot of the pattern P3 is made. Here, an interval LB between the pattern P2 and the pattern P3 is larger than an interval LA between the pattern P1 and the pattern P2, and, for example, the interval LB is about double the interval LA.

Next, the shot position of the electron beam is moved from the pattern P3 along the −X direction, and a shot of the pattern P4 is made. The shot of the pattern P4 is made at a position between the pattern P2 and the pattern P3, for example, at the midpoint between the pattern P2 and the pattern P3. The XY stage 105 has stopped at the time of the shot of each of the patterns P1 to P4.

Next, the drawn positions of the pattern P2 and the pattern P4 are measured by using a position measuring device, and an interval L between the pattern P2 and the pattern P4 is obtained. The drawn position of each pattern to be measured is, for example, the center of gravity of the pattern.

Here, when the interval LA between the pattern P1 and the pattern P2 is measured, the measurement result of the interval LA includes a deflection shift amount in the +X direction depending on the settling time, and a measurement error of the position measuring device. When the positions (x coordinates) of the patterns P1 and P2 are denoted by x1 and x2, the deflection shift amount in the +X direction depending on the settling time is denoted by +Δx, and the measurement error of the position measuring device is denoted by □±xrep, the interval LA is represented by the following formula (1).

$$LA = (x2 + \Delta x) - x1 \pm xrep \quad \text{formula (1)}$$
$$= (x2 - x1) + \Delta x \pm xrep$$

When the measurement result of the interval LA is simply doubled, an X deflection shift amount depending on the settling time is doubled, and the measurement error is also doubled, as in the following formula (2).

$$LA \times 2 = \{(x2 + \Delta x) - x1 \pm xrep\} \times 2 \quad \text{formula (2)}$$
$$= 2(x2 - x1) + 2\Delta x \pm 2xrep$$

The drawn position of the pattern P2 includes a deflection shift amount in the +X direction depending on the settling time. The drawn position of the pattern P4 includes a deflection shift amount in the −X direction depending on the settling time. When the measured positions (x coordinates) of the patterns P2 and P4 are denoted by x2 and x4, the deflection shift amount in the +X direction depending on the settling time is denoted by +Δx, the deflection shift amount in the −X direction is denoted by −Δx, and the measurement error of the position measuring device is denoted by □±xrep, the interval L is represented by the following formula (3).

$$L = (x4 - \Delta x) - (x2 + \Delta x) \pm xrep \quad \text{formula (3)}$$
$$= (x4 - x2) - 2\Delta x \pm xrep$$

As described above, in the measurement result of the interval L, the deflection shift amount in the +X direction and the deflection shift amount in the −X direction are added up, and the X deflection shift amount component becomes doubled as compared to the measurement result of the interval LA. On the other hand, in the measurement result of the interval L, the measurement error remains unchanged (does not become doubled) as compared to the measurement result of the interval LA. Thus, by measuring the interval L, it is possible to obtain a measurement result in which the X deflection shift amount depending on the settling time is emphasized.

Figure 4:
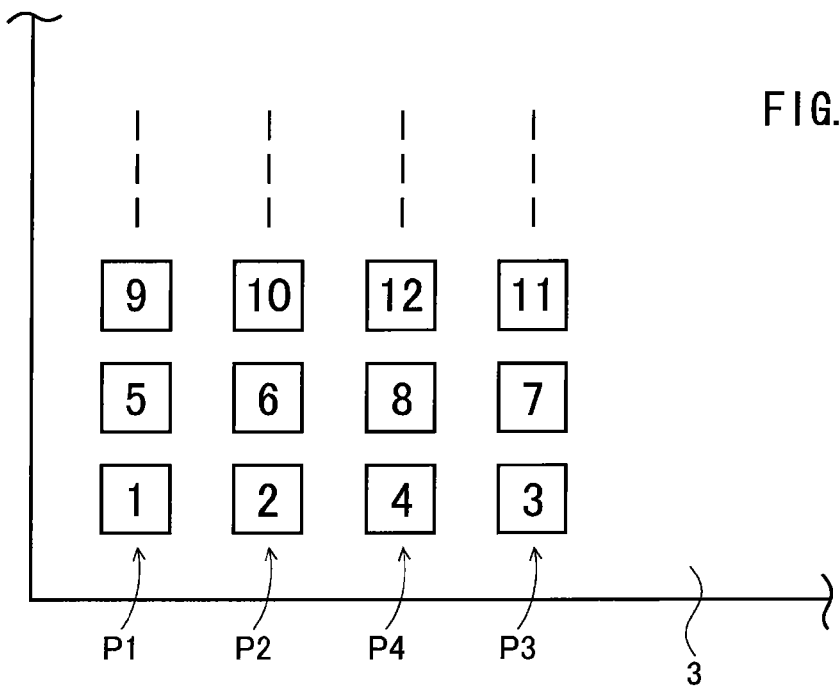
FIG. 4 is diagram showing an example of the evaluation pattern.

In order to reduce measurement variations, as shown in FIG. 4, drawing of the patterns P1 to P4 may be performed within the sub deflection region 3 a plurality of times with the settling time being fixed, to obtain the average of intervals L. In FIG. 4, numbers 1, 2, 3, ... represent the order of shots of the electron beam.

Figure 5:
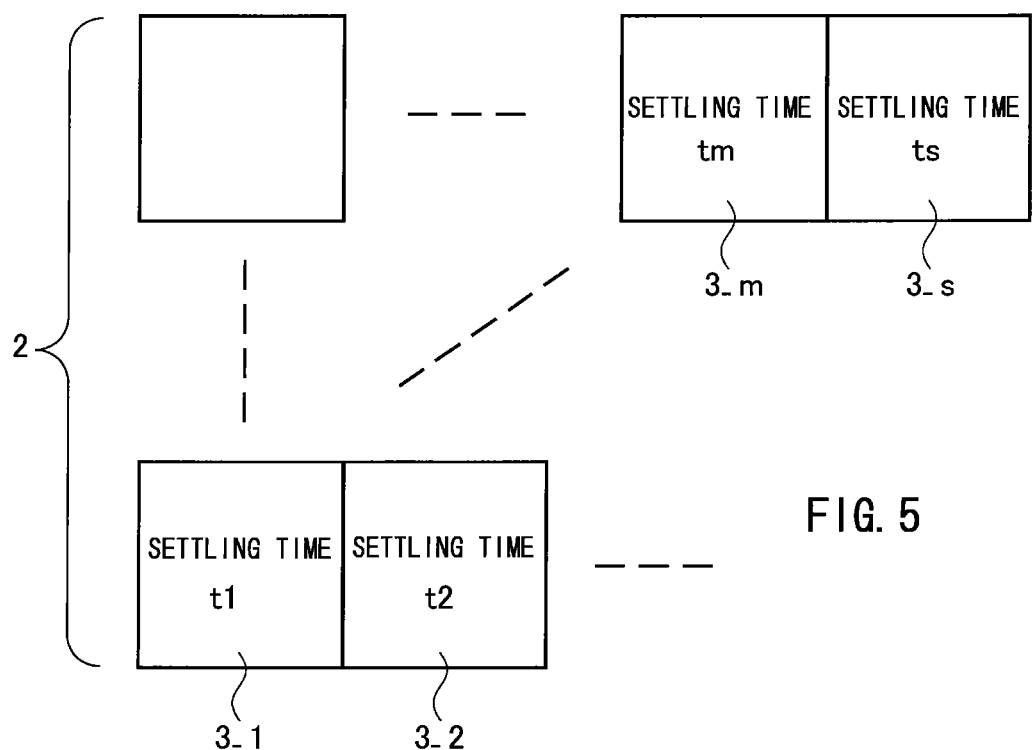
FIG. 5 is diagram showing an example of the evaluation pattern.

The evaluation pattern is drawn within a plurality of the sub deflection regions 3 in the main deflection region 2 while the settling time is changed. For example, as shown in FIG. 5, the settling time is set to t1 for a sub deflection region 3_1, the settling time is set to t2 for a sub deflection region 3_2, ... the settling time is set to tm for a sub deflection region 3_m (t1<t2<... tm, m is an integer equal to or greater than 3). In the sub deflection regions 3_1 to 3_m, the intervals L1 to Lm between the pattern P2 and the pattern P4 are measured.

For a sub deflection region 3_s, the settling time is set to ts which is sufficiently long. An interval Ls measured in the sub deflection region 3_s includes a very small X deflection shift amount depending on the settling time. The interval Ls is used as a reference value for the interval L.

By comparing the intervals L1 to Lm to the reference interval Ls, it is possible to evaluate the magnitude of the X deflection shift amount depending on the settling time. As the divergence from the reference interval Ls is greater, the X deflection shift amount depending on the settling time is determined as being greater.

Figure 6:
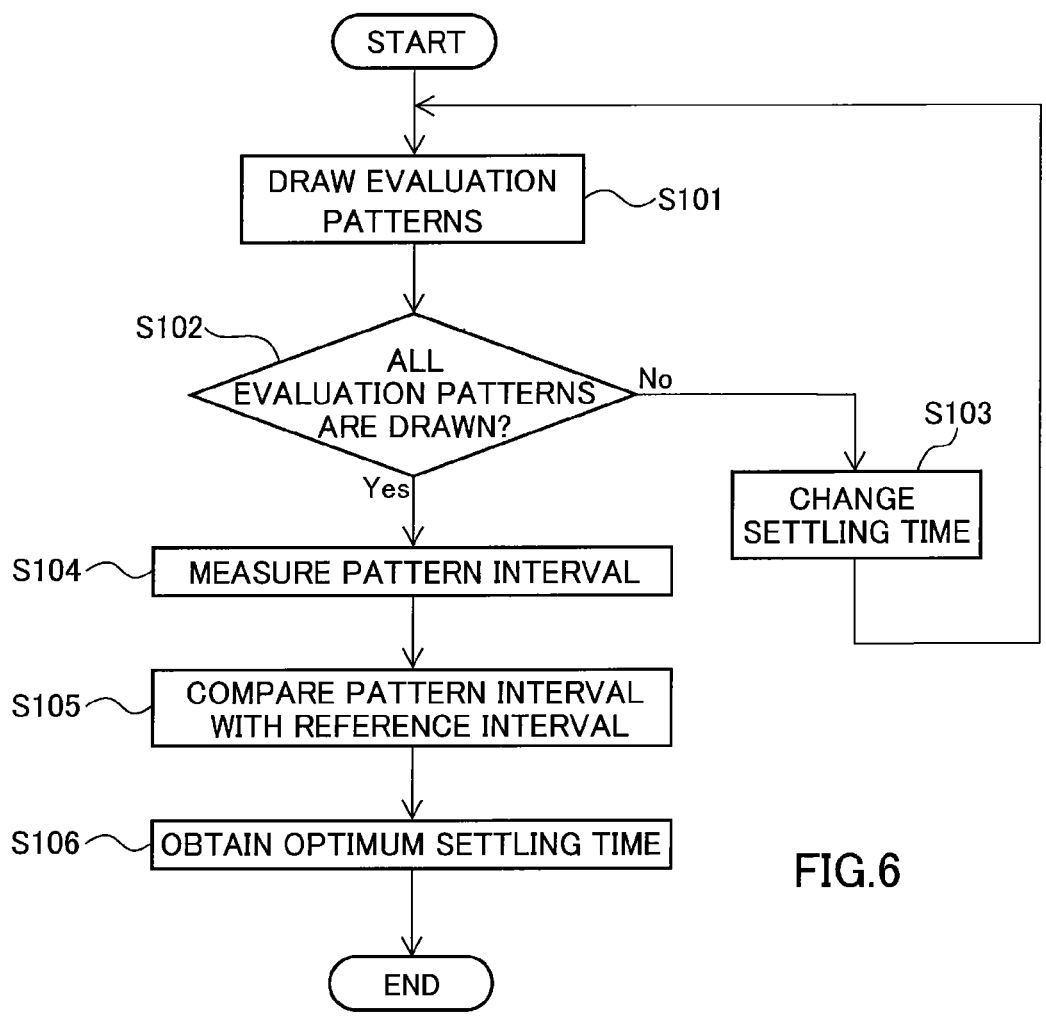
FIG. 6 is a flowchart illustrating a method for evaluating the drawing apparatus according to the first embodiment.

Next, a method for determining a suitable sub deflection settling time for the drawing apparatus 100 will be described with reference to a flowchart shown in FIG. 6.

By using the drawing apparatus 100, the above-described evaluation pattern including the patterns P1 to P4 is drawn in the sub deflection region 3 on the substrate 101 (step S101). At this time, the XY stage 105 has stopped. If the evaluation pattern is subsequently drawn (step S102_No), the settling time is changed (step S103), and the evaluation pattern is drawn in another sub deflection region 3.

By so doing, the evaluation patterns having different settling times are drawn in the sub deflection regions 3 on the substrate 101 (step S102_Yes). For example, as shown in FIG. 5, the evaluation patterns having the settling times t1 to tm are drawn in the sub deflection regions 3_1 to 3_m, respectively. In addition, the evaluation pattern is drawn in the sub deflection region 3_s with the sufficiently long settling time ts.

Next, the interval L between the pattern P2 and the pattern P4 is measured in each sub deflection region 3 (step S104). The shot position of the pattern P2 includes a deflection shift amount in the +X direction, and the shot position of the pattern P4 includes a deflection shift amount in the −X direction. Thus, in the measurement result of the interval L, the deflection shift amount in the +X direction and the deflection shift amount in the −X direction are added up and the X deflection shift amount depending on the settling time is emphasized.

For example, the intervals L1 to Lm are measured in the sub deflection regions 3_1 to 3_m. If the patterns P1 to P4 are drawn in a single sub deflection region 3 a plurality of times, the average of intervals L is obtained. In addition, the reference interval Ls is measured in the sub deflection region 3_s.

Figure 7:
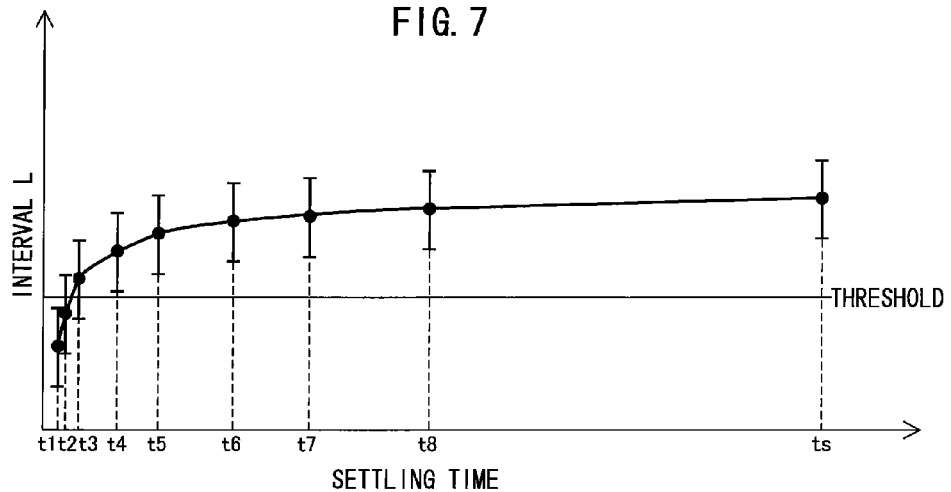
FIG. 7 is a graph showing an example of a measurement result of a pattern interval.

Next, the intervals L1 to Lm are compared to the reference interval Ls (step S105). FIG. 7 is a graph showing an example of the measurement result of the intervals L1 to Lm and the reference interval Ls. The shorter the settling time is, the greater the divergence (difference) from the reference interval Ls is.

Among settling times with which the difference from the reference interval Ls is equal to or less than a predetermined value, the shortest value is obtained as an optimum settling time (step S106). The optimum settling time may not be the average of the measurement result of the interval L and may be determined in consideration of variations. For example, in the example shown in FIG. 7, among settling times with which the difference from the reference interval Ls is equal to or less than the predetermined value and which include the variations of the measurement result, that is, among settling times with which the measurement result including the variations is equal to or greater than a threshold, the shortest settling time t4 may be set as an optimum settling time for the DAC amplifier 132 which controls the sub deflector 209.

Figure 8:
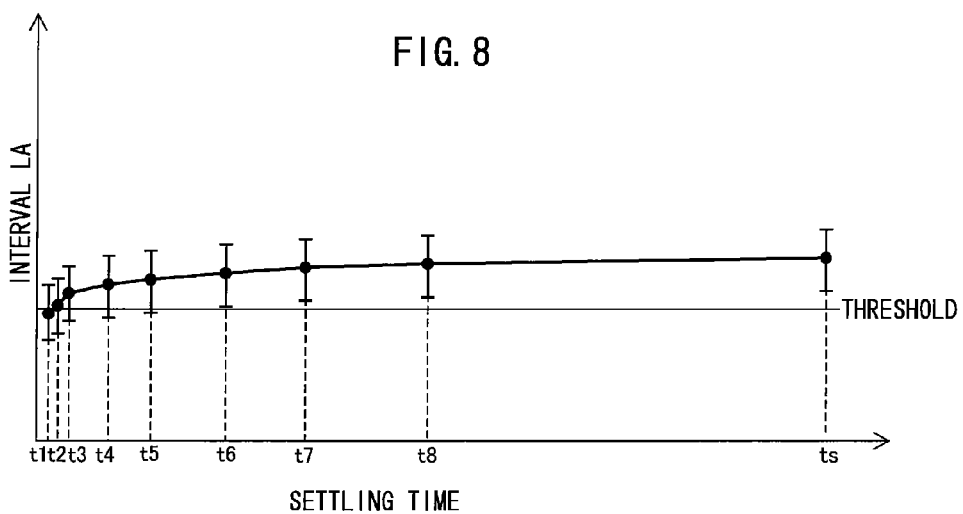
FIG. 8 is a graph showing an example of a measurement result of a pattern interval according to a comparative example.

FIG. 8 is a graph showing an example of a measurement result when the interval LA in FIG. 3 is measured in the sub deflection regions 3_1 to 3_m and 3_s, as a comparative example for the present embodiment. As described above, in the measurement result of the interval LA, a component of the X deflection shift amount is small (the ratio thereof is low), that is, a component of the measurement error, is great as compared to the measurement result of the interval L (L1 to Lm).

Therefore, as compared to the present embodiment shown in FIG. 7, in the measurement result of the interval LA shown in FIG. 8, in the region where the settling time is short, the rate of change of the interval LA relative to the settling time is low. Among settling times with which the difference from the reference interval including the variations of the measurement result is equal to or less than the predetermined value, that is, among settling times with which the measurement result including the variations is each equal to or greater than the threshold, the shortest settling time is t6. In the case where the measurement result of the interval LA is used, the optimum settling time for the DAC amplifier 132 which controls the sub deflector 209 is determined as t6. Meanwhile, in the present embodiment, it is possible to determine the optimum settling time as t4 (<t6), and it is possible to improve the throughput of the drawing process.

As described above, according to the present embodiment, it is possible to improve the accuracy of evaluation of the deflection shift amount depending on the settling time. In addition, it is possible to obtain the optimum settling time for the DAC amplifier 132 by measuring the interval L between the pattern P2 and the pattern P4 for each settling time and detecting the shortest settling time among the settling times with which the difference from the reference interval Ls is equal to or less than the predetermined value.

Figure 9:
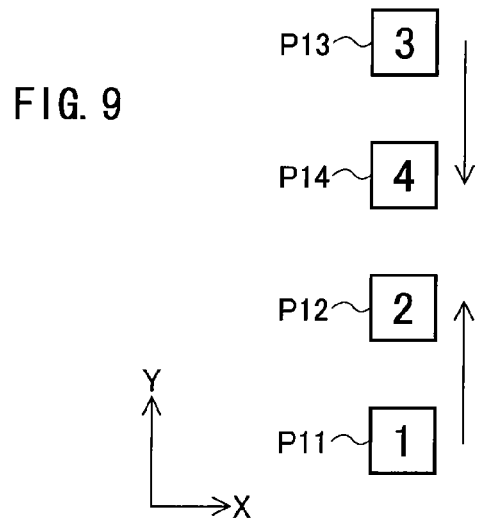
FIG. 9 is a diagram showing an example of an evaluation pattern.

In the above embodiment, the evaluation pattern in which the X deflection shift amount is emphasized has been described as an example. However, by drawing an evaluation pattern including patterns P11 to P14 aligned in the Y direction as shown in FIG. 9 and measuring the interval between the pattern P12 and the pattern P14, it is possible to obtain a measurement result in which a Y deflection shift amount is emphasized.

Figure 10:
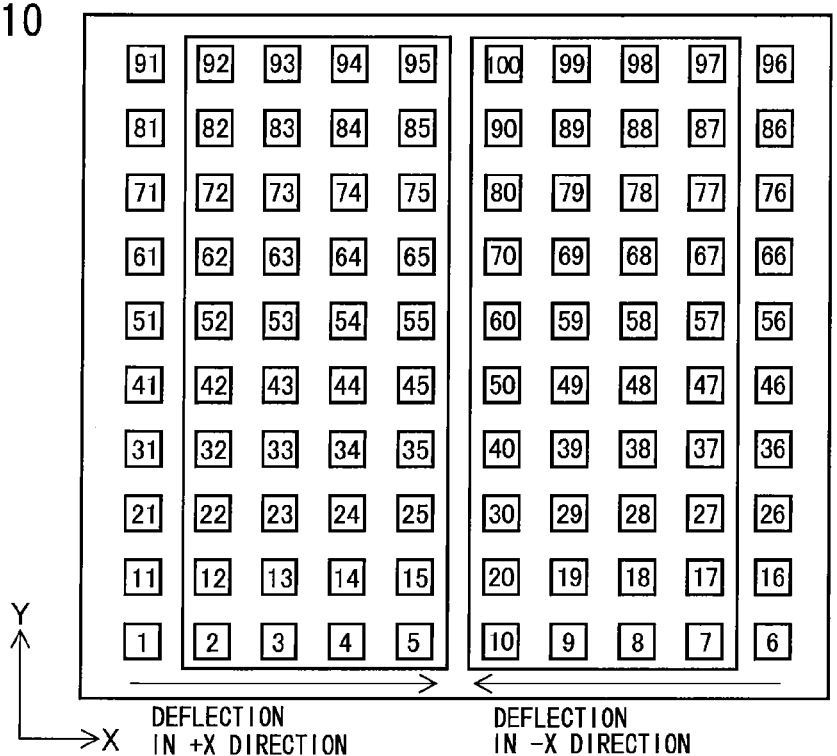
FIG. 10 is a diagram showing an example of the evaluation pattern.

A method in which a plurality of evaluation patterns are drawn in a single sub deflection region 3 is not limited to the example of FIG. 4, and patterns may be drawn in an order as in FIG. 10. In the example shown in FIG. 10, the first to fifth shots are made while the shot position is moved in the +X direction. Next, the sixth to tenth shots are made while the shot position is moved in the −X direction. The position is shifted in the Y direction, and the eleventh shot and the subsequent shots are made similarly to the first to tenth shots.

Then, the interval between the second shot position and the seventh shot position is measured, and a difference from a reference (a measurement result obtained when the settling time is made sufficiently long and the pattern is drawn) is obtained. Similarly, the interval between the third shot position and the eighth shot position is measured, and a difference from the reference is obtained. The interval between the fourth shot position and the ninth shot position is measured, and a difference from the reference is obtained. The interval between the fifth shot position and the tenth shot position is measured, and a difference from the reference is obtained. The same measurement is performed for rows having different positions in the Y direction. Then, the average of the obtained differences is calculated. Even with such a drawing method, it is possible to improve the accuracy of evaluation of the X deflection shift amount depending on the settling time.

Second Embodiment

In the first embodiment described above, the accuracy of the position depending on the settling time is evaluated. In the present embodiment, the accuracy of a dimension depending on the settling time is evaluated, and a settling time suitable for shaping deflection by which the figure size of a beam shot is changed is obtained.

Figure 11:
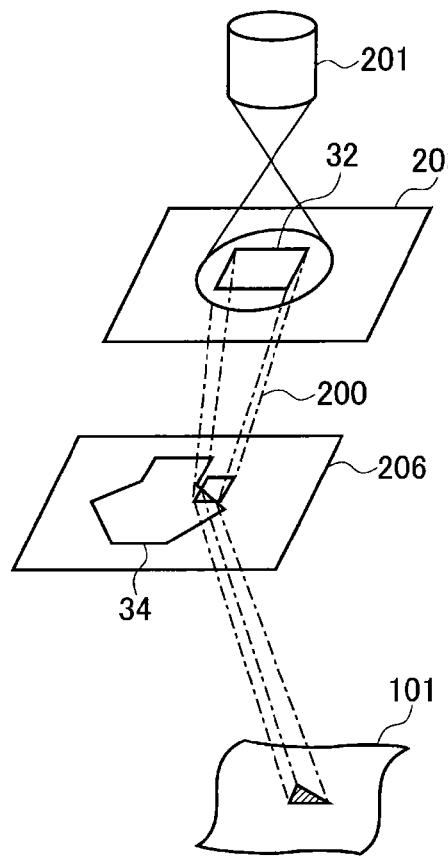
FIG. 11 is a diagram illustrating beam shaping.

FIG. 11 is a schematic perspective view for illustrating beam shaping with the first shaping aperture 203 and the second shaping aperture 206. The first shaping aperture 203 has a rectangular (rectangle-shaped or square-shaped) opening 32 for shaping the electron beam 200. The electron beam 200 of an aperture image having passed through the first shaping aperture 203 is projected by the projection lens 204 (see FIG. 1) onto the second shaping aperture 206 having a variable shaping opening 34. At this time, deflection of the aperture image projected onto the second shaping aperture 206 is controlled by the shaping deflector 205 (see FIG. 1), whereby it is possible to change the shape and dimension of the electron beam passing through the variable shaping opening 34 (perform variable shaping).

Figure 12:
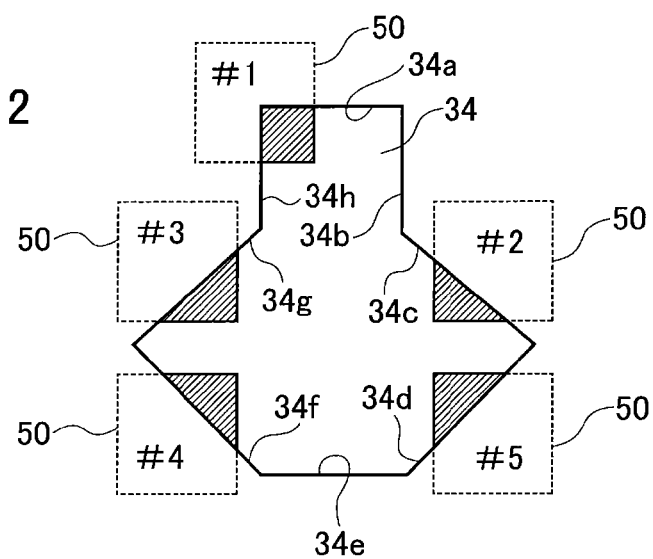
FIG. 12 is a diagram showing a variable shaping opening of a second shaping aperture.

FIG. 12 is a plan view showing an example of positions where an aperture image 50 having passed through the opening 32 of the first shaping aperture 203 overlaps the variable shaping opening 34 of the second shaping aperture 206. The variable shaping opening 34 has a shape obtained by combining sides 34a and 34e parallel to a side of the opening 32, sides 34b and 34h orthogonal to the side of the opening 32, and sides 34c, 34d, 34f, and 34g which form an angle of 45 degrees or 135 degrees relative to the side of the opening 32.

The variable shaping opening 34 has an octagonal shape including a hexagonal portion surrounded by the sides 34c to 34g and a tetragonal portion surrounded by the sides 34a, 34b, and 34h and connected to the hexagonal shape portion.

When the electron beam 200 is shaped into a rectangular shape, the aperture image 50 is deflected by the shaping deflector 205 and applied to a position shown by #1. A diagonally shaded portion passing through the variable shaping opening 34 is a shaped image. When the aperture image 50 is applied to positions shown by #2 to #5 at the sides 34c, 34g, 34f, and 34d, the electron beam 200 is shaped into right-angled isosceles triangles.

By changing the applied position (deflection position) of the aperture image 50 on the second shaping aperture 206 as described above, it is possible to shape the electron beam 200 into five types of figures having a desired size (a rectangular shape and four types of right-angled isosceles triangles). In addition, by changing the size of the portion of the aperture image 50 that passes through the variable shaping opening 34, the dimension of the image (shot) changes while the rectangular shape or the right-angled isosceles triangle shapes which are similar shapes are maintained.

In the present embodiment, an evaluation substrate is placed as the substrate 101 on the XY stage 105, the following evaluation pattern is drawn, and a dimension variation amount depending on the settling time for the deflection DAC amplifier 136 which performs shaping deflection is evaluated.

FIGS. 13A and 13B and FIGS. 14A and 14B show an example of a method for drawing the evaluation pattern for evaluating the dimension variation amount depending on the settling time. First, as shown in FIG. 13A, an amount of deflection by the shaping deflector 205 is controlled such that the size of the portion of the aperture image 50 that passes through the variable shaping opening 34 is large, and a pattern P21 having a design dimension d as shown in FIG. 14A is drawn.

Next, as shown in FIG. 13B, the amount of deflection by the shaping deflector 205 is controlled such that the size of the portion of the aperture image 50 that passes through the variable shaping opening 34 is small, and a pattern P22 having a design dimension d as shown in FIG. 14B is drawn. In FIGS. 14A and 14B, a broken line indicates a shaped size before deflect, and a solid line indicates a shaped size after deflection.

Similarly to the first embodiment described above, the evaluation pattern including such patterns P21 and P22 is drawn on the substrate 101 while the settling time for the DAC amplifier 136 is changed.

Subsequently, the dimension d1 of the pattern P21 and the dimension d2 of the pattern P21 are measured by using a measuring device. Then, a dimension variation amount of the dimension d1 from the design dimension d and a dimension variation amount of the dimension d2 from the design dimension d are added up to calculate a total value D. A dimension variation amount in a + direction depending on the settling time is included in the dimension d1 of the pattern P21. A dimension variation amount in a − direction depending on the settling time is included in the dimension d2 of the pattern P22. Therefore, in the total value D, the dimension variation amount depending on the settling time is doubled as compared to the dimension variation amount of the dimension d1 (or d2) from the design dimension d. Meanwhile, the measurement error remains unchanged (does not become doubled). Therefore, in the total value D, the dimension variation amount depending on the settling time is emphasized.

By comparing the total value D for each settling time to a reference total value Ds obtained in the case where the settling time is made sufficiently long, it is possible to accurately evaluate the dimension variation amount depending on the settling time. In addition, among settling times with which the difference from the total value Ds is equal to or less than a predetermined value, it is possible to obtain the shortest value as a suitable settling time.

In the second embodiment described above, the rectangular pattern as shown in FIGS. 13A, 13B, 14A and 14B has been described as an example, but the pattern may be a right-angled isosceles triangle.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for evaluating a charged particle beam drawing apparatus which performs drawing by deflecting a charged particle beam with a deflector disposed on an optical path for the charged particle beam, the method comprising:
making a shot of a first pattern;
controlling an amount of deflection by the deflector to move an applied position of the charged particle beam from the first pattern along a first direction, and making a shot of a second pattern;
controlling the amount of deflection by the deflector to move the applied position of the charged particle beam from the second pattern along the first direction, and making a shot of a third pattern;
controlling the amount of deflection by the deflector to move the applied position of the charged particle beam from the third pattern along a second direction opposite to the first direction, and making a shot of a fourth pattern between the second pattern and the third pattern;
measuring positions of the second pattern and the fourth pattern and calculating an interval between the second pattern and the fourth pattern; and
comparing the calculated interval to a reference interval.

2. The method according to claim 1, wherein
while a settling time for a DAC amplifier which drives the deflector is varied, the shots of the first to fourth patterns are made for each settling time,
an interval between the second pattern and the fourth pattern and a difference from the reference interval are calculated for each settling time, and
a settling time with which the difference is equal to or less than a predetermined value is obtained.

3. The method according to claim 2, wherein an interval between the second pattern and the fourth pattern the shots of which are made with a settling time equal to or longer than a predetermined time is set as the reference interval.

4. The method according to claim 2, wherein
the shots of the first to fourth patterns are made with each settling time a plurality of times,
an average of intervals between the second pattern and the fourth pattern is calculated, and
a difference between the average and the reference interval is calculated.

5. The method according to claim 2, wherein
the shots of the first to fourth patterns are made with each settling time a plurality of times, and
among the settling times with which all intervals between the second pattern and the fourth pattern are included in a predetermined range from the reference interval, the shortest settling time is selected.

6. The method according to claim 2, wherein
the charged particle beam drawing apparatus includes a main deflector and a sub deflector, and
an amount of deflection by the sub deflector is controlled to make shots of the first to fourth patterns.

7. The method according to claim 6, wherein the shots of the first to fourth patterns are made with the settling time being changed for each sub deflection region.

8. A method for evaluating a charged particle beam drawing apparatus which performs drawing by deflecting a charged particle beam with a deflector disposed on an optical path for the charged particle beam, the method comprising:
moving an applied position of the charged particle beam along a first direction, and making shots of first to mth patterns with a predetermined interval therebetween (m is an integer equal to or greater than 3);
moving the applied position of the charged particle beam from the mth pattern along the first direction, and making a shot of a (m+1)th pattern;
moving the applied position of the charged particle beam from the (m+1)th pattern along a second direction opposite to the first direction, and making shots of (m+2)th to 2mth patterns between the mth pattern and the (m+1)th pattern;

measuring positions of the second to mth patterns and the (m+2)th to 2mth patterns;

calculating an interval between the (2+k)th pattern and the (m+2+k)th pattern (k is a continuous integer which satisfies $0 \leq k \leq m-2$); and comparing the calculated interval to a reference interval.

* * * * *